US008629461B2

(12) United States Patent
Imai

(10) Patent No.: US 8,629,461 B2
(45) Date of Patent: *Jan. 14, 2014

(54) LIGHT RECEIVING AND EMITTING DEVICE

(71) Applicant: Seiko Epson Corporation, Tokyo (JP)

(72) Inventor: Yasutaka Imai, Suwa (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/693,624

(22) Filed: Dec. 4, 2012

(65) Prior Publication Data

US 2013/0092959 A1 Apr. 18, 2013

Related U.S. Application Data

(63) Continuation of application No. 12/767,103, filed on Apr. 26, 2010, now Pat. No. 8,344,393.

(30) Foreign Application Priority Data

May 8, 2009 (JP) .................................. 2009-113492

(51) Int. Cl.
*H01L 31/153* (2006.01)

(52) U.S. Cl.
USPC 257/84; 257/85; 257/E33.077; 257/E31.096; 372/50.21

(58) Field of Classification Search
CPC ... H04L 25/167; H04L 31/125; H04L 31/145; H04L 31/147; H04L 31/153; H04L 31/16; H04L 31/165; H04L 31/167; H04L 31/173; H01S 5/0264; H01S 5/0683; H01S 5/06832; H01S 5/4056; H01S 5/0262

USPC ................ 257/84, 85, 80, E31.096, E33.077; 372/50.21

See application file for complete search history.

(56) References Cited

U.S. PATENT DOCUMENTS

| | | | |
|---|---|---|---|
| 7,142,343 B2 | 11/2006 | Kim et al. | |
| 8,344,393 B2 * | 1/2013 | Imai | ................................ 257/84 |
| 2002/0131465 A1 | 9/2002 | Lo et al. | |
| 2005/0185881 A1 | 8/2005 | Murata | |

FOREIGN PATENT DOCUMENTS

| | | |
|---|---|---|
| JP | 04-026159 | 1/1992 |
| JP | 04-033386 | 2/1992 |
| JP | 08-162669 | 6/1996 |
| JP | 10-003691 | 1/1998 |
| JP | 2005-183955 | 7/2005 |
| JP | 2005-216954 A | 8/2005 |
| JP | 2009-238826 | 10/2009 |
| JP | 2009-238828 | 10/2009 |
| JP | 2009-238843 | 10/2009 |
| JP | 2009-238845 | 10/2009 |
| JP | 2009-328846 | 10/2009 |

* cited by examiner

*Primary Examiner* — Yu Chen
(74) *Attorney, Agent, or Firm* — Harness, Dickey & Pierce, P.L.C.

(57) ABSTRACT

A light emitting device includes: a light emitting unit and a light receiving unit which are provided on a same substrate, wherein the light emitting unit includes an active layer sandwiched between a first clad layer and a second clad layer, a first electrode electrically connected to the first clad layer, and a second electrode electrically connected to the second clad layer.

8 Claims, 5 Drawing Sheets

LIGHT RECEIVING AND EMITTING DEVICE

CROSS-REFERENCE TO RELATED APPLICATIONS

This is a continuation application of U.S. application Ser. No. 12/767,103 filed Apr. 26, 2010 which claims priority to Japanese Patent Application No. 2009-113492 filed May 8, 2009, all of which are incorporated by reference in their entireties.

BACKGROUND

1. Technical Field

The present invention relates to light receiving and emitting devices.

2. Related Art

In a semiconductor light emitting device used in optical communications and the like, adjustment of the amount of light etc. is performed by extracting part of light emitted from the device with a semi-transmissive mirror and a diffraction element placed outside the device and detecting the light by a light receiving element.

For example, in JP-A-10-3691, an optical pickup device that makes light from a laser diode branch off by a spectroscopic prism or the like and includes a monitoring photodiode detecting the branched light has been proposed.

On the other hand, in recent years, a high-brightness laser device with excellent color reproducibility has been expected to be used as a light emitting device for a light source of a display device such as a projector or a display. However, when a laser diode is used in the display device, adequate brightness may not be obtained unless a plurality of laser diodes are used. Also in such a display device, in order to reduce unevenness of brightness, it is necessary to adjust the amount of light by detecting the amount of light of the light emitting device.

However, since a light emitting element and a light receiving element are separately provided in the method disclosed in JP-A-10-3691, the method needs an extra optical element such as a spectroscopic prism or the like. This results in an increase in the number of parts and makes it difficult to realize miniaturization. Moreover, to use a laser diode in the display device, the amounts of light of a plurality of laser diodes have to be detected individually, but it is difficult to provide the light receiving element for each of the laser diodes.

SUMMARY

An advantage of some aspects of the invention is to provide a light receiving and emitting device that allows a light emitting unit and a light receiving unit to be mounted on the same substrate and that can detect the amounts of light individually.

According to an aspect of the invention, a light receiving and emitting device includes: a light emitting unit and a light receiving unit which are provided on the same substrate, wherein the light emitting unit includes: an active layer sandwiched between a first clad layer and a second clad layer; a first electrode electrically connected to the first clad layer; and a second electrode electrically connected to the second clad layer, the light receiving unit includes a light-absorbing layer, at least part of the active layer forms a gain region on a current path between the first electrode and the second electrode, the gain region is provided from a first side face of the active layer to a second side face parallel to the first side face so as to be inclined with respect to a perpendicular of the first side face as seen in a planar view, a light generated in the gain region is divided, at at least one of an edge face on the first side face and an edge face on the second side face, the edge faces of the gain region, into a light emitted to the outside and a reflected light, and the reflected light is received by the light receiving unit.

With the light receiving and emitting device described above, it is possible to mount the light emitting unit and the light receiving unit on the same substrate and detect the amounts of light individually.

Incidentally, in the description of the invention, the term "on" is used in the wording such as "on one specific thing (hereinafter referred to as "A"), another specific thing (hereinafter referred to as "B") is formed". In the description of the invention, the term "on" used in such wording should be understood to cover both a case where B is directly formed on A and a case where B is formed on A with a still another thing laid between A and B.

In the light receiving and emitting device according to the aspect of the invention, the light receiving unit may be provided on the side where the first side face is present and on the side where the second side face is present.

With the light receiving and emitting device described above, it is possible to monitor both the light emitted from the edge face on the first side face and the light emitted from the edge face on the second side face.

The light receiving and emitting device according to the aspect of the invention may further include a separation groove electrically separating the light emitting unit and the light receiving unit.

With the light receiving and emitting device described above, it is possible to separate the light emitting unit and the light receiving unit electrically.

In the light receiving and emitting device according to the aspect of the invention, the separation groove may surround the light receiving unit as seen in a planar view.

With the light receiving and emitting device described above, it is possible to achieve electrical separation between the light emitting unit and the light receiving unit more effectively.

In the light receiving and emitting device according to the aspect of the invention, the active layer and the light-absorbing layer may be formed as a continuous one layer.

With the light receiving and emitting device described above, it is possible to simplify a production process.

In the light receiving and emitting device according to the aspect of the invention, the level of the under surface of the active layer may be higher than the level of the under surface of the light-absorbing layer, and the level of the upper surface of the active layer may be lower than the level of the upper surface of the light-absorbing layer.

With the light receiving and emitting device described above, it is possible to improve light detection efficiency of the light receiving unit.

In the light receiving and emitting device according to the aspect of the invention, in the gain region, the edge face on the first side face and the edge face on the second side face may not overlap as seen from the first side face in a planar view.

With the light receiving and emitting device described above, it is possible to suppress or prevent the occurrence of lasing in the gain region more reliably, which will be described later.

In the light receiving and emitting device according to the aspect of the invention, the gain region may include a plurality of gain regions, the gain regions being arranged, and the light receiving unit may be provided for each of the plurality of gain regions.

With the light receiving and emitting device described above, it is possible to emit light on high power.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a preferred embodiment of the invention will be described with reference to the drawings.

1. Light Receiving and Emitting Device

First, a light receiving and emitting device 1000 according to the embodiment will be described.

Figure 1:
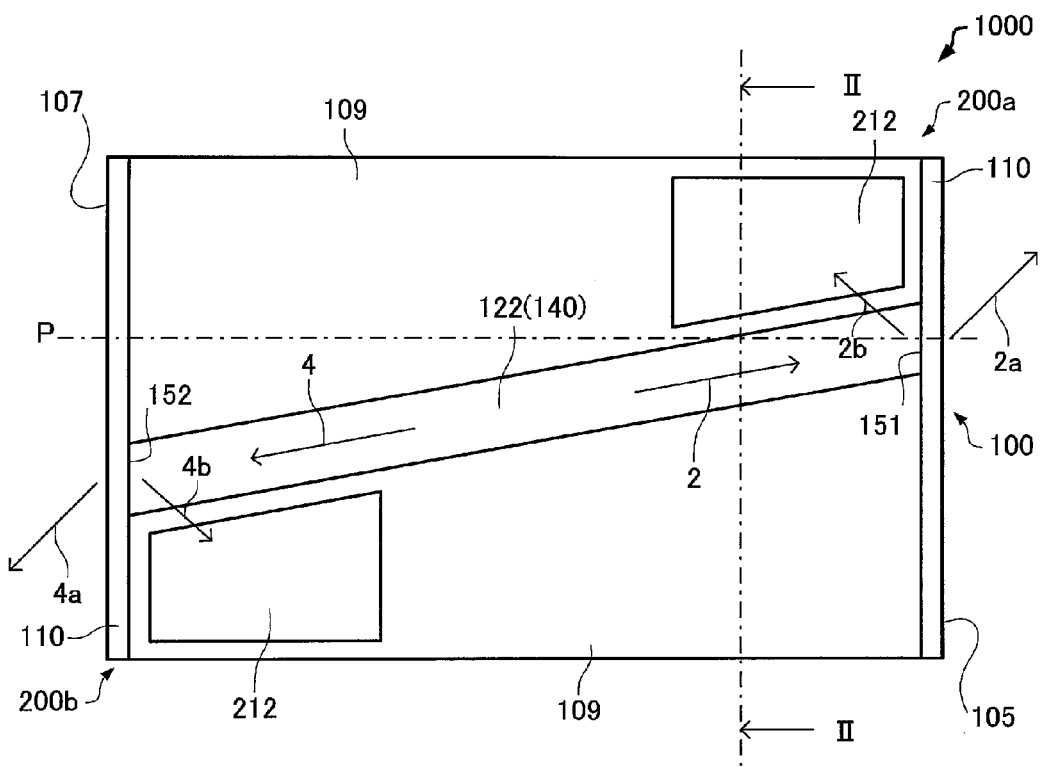
FIG. 1 is a plan view schematically showing a light receiving and emitting device according to an embodiment.
Figure 2:
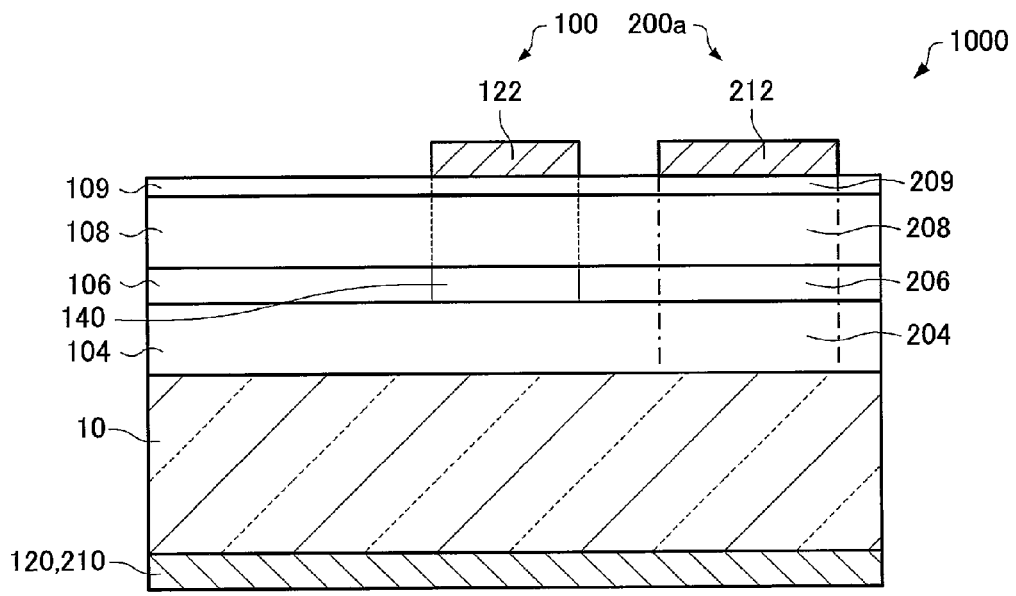
FIG. 2 is a sectional view schematically showing the light receiving and emitting device according to the embodiment.

FIG. 1 is a plan view schematically showing the light receiving and emitting device 1000 according to an embodiment to which the invention is applied. FIG. 2 is a sectional view schematically showing the light receiving and emitting device 1000, and is a sectional view taken on the line II-II of FIG. 1.

As shown in FIGS. 1 and 2, the light receiving and emitting device 1000 according to the embodiment includes a light emitting unit 100 and light receiving units 200a and 200b, the light emitting unit 100 and the light receiving units 200a and 200b which are provided on the same substrate 10. As the substrate 10, a first conductivity type (for example, an n-type) GaAs substrate, for example, can be used.

Hereinafter, the configurations of the light emitting unit 100 and the light receiving units 200a and 200b and the operation of the light receiving and emitting device 1000 will be described.

(1) Configuration of the Light Emitting Unit

As shown in FIG. 2, the light emitting unit 100 has an active layer 106 sandwiched between a first clad layer 104 and a second clad layer 108, a first electrode 120, and a second electrode 122. The light emitting unit 100 may also have a first contact layer 109.

The first clad layer 104 is formed on the substrate 10. The first clad layer 104 is formed of, for example, a first conductivity type semiconductor. As the first clad layer 104, an n-type AlGaAs layer, for example, can be used. Incidentally, though not shown in the drawing, a buffer layer may be formed between the substrate 10 and the first clad layer 104. As the buffer layer, a first conductivity type (an n-type) GaAs layer, for example, which has better crystallinity (such as lower defect density) than the substrate 10 can be used.

The active layer 106 is formed on the first clad layer 104. The active layer 106 has a multiple quantum well structure (MQW) in which three quantum well structures, each being formed of a GaAs well layer and an AlGaAs barrier layer, for example, are stacked one on top of each other.

Part of the active layer 106 forms a gain region. The active layer 106 may be in the shape of a rectangular parallelepiped (including a cube), for example. As shown in FIG. 1, the active layer 106 has a first side face 105 and a second side face 107 parallel to the first side face 105. The gain region 140 has a first edge face 151 provided on the first side face 105 and a second edge face 152 provided on the second side face 107. Since an antireflection film 110, for example, is provided on the first edge face 151 and the second edge face 152, it is possible to obtain a low reflectivity. The antireflection film 110 can be provided all over the first side face 105 and the second side face 107. As the antireflection film 110, an $Al_2O_3$ single layer, or a $SiO_2$ layer, a SiN layer, a $Ta_2O_5$ layer or a multiple layer formed of these layers, for example, can be used. By adjusting the film thickness, the number of layers, and the like, of the antireflection film 110, it is possible to control the reflectivity of the first edge face 151 and the second edge face 152. The planar shape of the gain region 140 is, for example, a parallelogram shown in FIG. 1. As shown in FIG. 1, the gain region 140 is provided from the first side face 105 to the second side face 107 so as to be linearly inclined with respect to a perpendicular P of the first side face 105 as seen in a planar view. As a result, it is possible to suppress or prevent the occurrence of lasing in the gain region 140.

Figure 3:
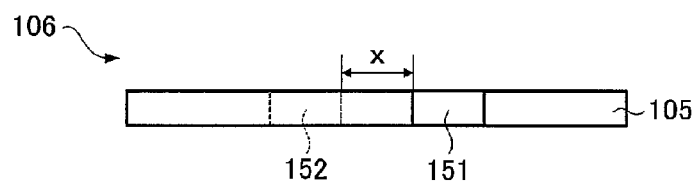
FIG. 3 shows an active layer of the light receiving and emitting device according to the embodiment, the active layer as seen from a first side face in a planar view.

FIG. 3 shows the active layer 106 as seen from the first side face 105 in a planar view. As shown in FIG. 3, in the gain region 140, the first edge face 151 and the second edge face 152 do not overlap each other as seen from the first side face 105 in a planar view. This makes it possible to prevent direct multiple reflection of the light generated in the gain region 140 from occurring between the first edge face 151 and the second edge face 152. This helps prevent a direct resonator from being formed, making it possible to suppress or prevent the occurrence of lasing in the gain region 140 more reliably. Therefore, the light receiving and emitting device 1000 can emit a light that is not a laser light. Incidentally, in this case, as shown in FIG. 3, in the gain region 140, for example, a displacement width x between the first edge face 151 and the second edge face 152 may take on a value.

The second clad layer 108 is formed on the active layer 106. The second clad layer 108 is formed of, for example, a second conductivity type (for example, a p-type) semiconductor. As the second clad layer 108, a p-type AlGaAs layer, for example, can be used.

For example, a pin diode is formed of the p-type second clad layer 108, the active layer 106 doped with no impurities, and the n-type first clad layer 104. Each of the first clad layer 104 and the second clad layer 108 is a layer having a greater band gap energy and a lower refractive index than those of the active layer 106. The active layer 106 has the function of amplifying light. The first clad layer 104 and the second clad layer 108 have the function of trapping injected carriers (electrons and holes) and light with the active layer 106 sandwiched between the first clad layer 104 and the second clad layer 108.

The first contact layer 109 is formed on the second clad layer 108. As the first contact layer 109, a layer forming an ohmic contact with the second electrode 122 can be used. The first contact layer 109 is formed of, for example, a second conductivity type semiconductor. As the first contact layer 109, a p-type GaAs layer, for example, can be used.

The first electrode 120 can be formed under the substrate 10. In an example shown in FIG. 2, the first electrode 120 is formed allover the underside of the substrate 10. The first electrode 120 can be in contact with a layer (in the example shown in the drawing, the substrate 10) forming an ohmic contact with the first electrode 120. The first electrode 120 is electrically connected to the first clad layer 104 via the substrate 10. The first electrode 120 is one electrode for driving the light emitting unit 100. As the first electrode 120, an electrode formed by laying, on the substrate 10, a Cr layer, a AuGe layer, a Ni layer, and a Au layer in this order, for example, can be used. The first electrode 120 may be the same electrode as that formed as a third electrode 210.

The second electrode 122 is formed on the first contact layer 109. The second electrode 122 is electrically connected to the second clad layer 108 via the first contact layer 109. The second electrode 122 is the other electrode for driving the light emitting unit 100. As the second electrode 122, an electrode formed by laying, on the first contact layer 109, a Cr layer, a AuZn layer, and a Au layer in this order, for example, can be used. As shown in FIG. 1, the under surface of the second electrode 122 has the same planar shape as the gain region 140. In other words, in the example shown in the drawing, the planar shape of the under surface of the second electrode 122 determines a current path between the electrodes 120 and 122, and, consequently, determines the planar shape of the gain region 140 of the active layer 106. Alternatively, after an insulator layer (not shown) is formed on the first contact layer 109, the first contact layer 109 may be exposed by removing the insulator layer so as to have the same planar shape as the gain region 140, and the second electrode 122 may be formed so as to have a shape in contact with at least the exposed first contact layer 109.

(2) Configuration of the Light Receiving Unit

As shown in FIGS. 1 and 2, the light receiving units 200a and 200b include a light-absorbing layer 206. The light receiving units 200a and 200b can further include, for example, a third clad layer 204, a fourth clad layer 208, a second contact layer 209, a third electrode 210, and a fourth electrode 212.

As shown in FIG. 1, the light receiving units 200a and 200b can include a first light receiving unit 200a on the side where the first side face 105 of the active layer 106 is present and a second light receiving unit 200b on the side where the second side face 107 of the active layer 106 is present. Incidentally, the light receiving units 200a and 200b may be provided on only one side of the active layer 106. The first light receiving unit 200a is placed on an optical path of a first reflected light 2b reflected from the first edge face 151 of the gain region 140. The second light receiving unit 200b is placed on an optical path of a second reflected light 4b reflected from the second edge face 152 of the gain region 140. It is preferable that the first light receiving unit 200a be provided near the first edge face 151. Likewise, it is preferable that the second light receiving unit 200b be provided near the second edge face 152. This makes it possible to prevent the reflected lights 2b and 4b from being absorbed by a region other than the light receiving units 200a and 200b.

The third clad layer 204 is formed on the substrate 10. The third clad layer 204 is formed of, for example, a first conductivity type semiconductor. As the third clad layer 204, an n-type AlGaAs layer, for example, can be used. The third clad layer 204 and the first clad layer 104 can be formed of one continuous layer.

The light-absorbing layer 206 is formed on the third clad layer 204. As the light-absorbing layer 206, a GaAs layer doped with no impurities, for example, can be used. As will be described later, the light-absorbing layer 206 can absorb part of the light generated in the gain region 140. The light-absorbing layer 206 and the active layer 106 can be formed of one continuous layer.

The fourth clad layer 208 is formed on the light-absorbing layer 206. The fourth clad layer 208 is formed of, for example, a second conductivity type (for example, a p-type) semiconductor. As the fourth clad layer 208, a p-type AlGaAs layer, for example, can be used. The fourth clad layer 208 and the second clad layer 108 can be formed of one continuous layer.

A pin diode can be formed of the p-type fourth clad layer 208, the light-absorbing layer 206 doped with no impurities, and the n-type third clad layer 204. Each of the third clad layer 204 and the fourth clad layer 208 is a layer having a greater band gap energy and a lower refractive index than those of the light-absorbing layer 206. The light-absorbing layer 206 has the function of absorbing light. The third clad layer 204 and the fourth clad layer 208 have the function of trapping light with the light-absorbing layer 206 sandwiched between the third clad layer 204 and the fourth clad layer 208.

The second contact layer 209 is formed on the fourth clad layer 208. As the second contact layer 209, a layer forming an ohmic contact with the second electrode 122 can be used. The second contact layer 209 is formed of, for example, a second conductivity type semiconductor. As the second contact layer 209, a p-type GaAs layer, for example, can be used. The second contact layer 209 and the first contact layer 109 can be formed of one continuous layer.

As shown in FIG. 2, the layer structure of the light receiving units 200a and 200b from the third electrode 210 to the fourth electrode 212 may be the same as the layer structure of the light emitting unit 100 from the first electrode 120 to the second electrode 122.

The third electrode 210 is formed under the substrate 10. In the example shown in the drawing, the third electrode 210 is the same electrode as that formed as the first electrode 120. The third electrode 210 is one electrode for driving the light receiving unit. The third electrode 210 is electrically connected to the third clad layer 204 via the substrate 10. As the third electrode 210, the same material as the material for the first electrode 120 can be used.

The fourth electrode 212 is formed on the second contact layer 209. The fourth electrode 212 is the other electrode for driving the light receiving unit. The fourth electrode 212 is electrically connected to the fourth clad layer 208 via the second contact layer 209. As the fourth electrode 212, the same material as the material for the second electrode 122 can be used.

(3) Operation of the Light Receiving and Emitting Device

In the light emitting unit 100 of the light receiving and emitting device 1000, when a forward bias voltage of the pin diode is applied between the first electrode 120 and the second electrode 122, recombination of an electron with a hole occurs in the gain region 140 of the active layer 106. This recombination causes light to be generated. The stimulated emission of radiation starts from the generated light in a chain reaction, whereby the intensity of the light is amplified in the gain region 140. For example, as shown in FIG. 1, of the light generated in the gain region 140, a light 2 guided toward the first edge face 151 is amplified in the gain region 140, and is then emitted from the first edge face 151 as a first emission light 2a. Likewise, of the light generated in the gain region 140, a light 4 guided toward the second edge face 152 is amplified in the gain region 140, and is then emitted from the second edge face 152 as a second emission light 4a. Here, part of the light 2 guided toward the first edge face 151 and part of the light 4 guided toward the second edge face 152 are reflected from the first edge face 151 and the second edge face 152, and then travel inside the light receiving and emitting device 1000 as the first reflected light 2b and the second reflected light 4b. That is, of the light generated in the gain region 140, the light 2 guided toward the first edge face 151 is divided at the first edge face 151 into the first emission light 2a and the first reflected light 2b. Likewise, the light 4 guided toward the second edge face 152 is divided at the second edge face 152 into the second emission light 4a and the second reflected light 4b. The first reflected light 2b travels inside the light receiving and emitting device 1000 and arrives at the first light receiving unit 200a. Similarly, the second reflected light 4b travels inside the light receiving and emitting device 1000 and arrives at the second light receiving unit 200b. Incidentally, in the example shown in FIG. 1, a case in which the light is emitted from both the first edge face 151 and the second edge face 152 has been described; however, the light may be emitted from any one of the edge faces.

In the light receiving units 200a and 200b of the light receiving and emitting device 1000, when a reverse bias voltage of the pin diode is applied between the third electrode 210 and the fourth electrode 212, an electron-hole pair generated in the light-absorbing layer 206 by the reflected lights 2b and 4b is accelerated and can be extracted as current. This allows the light receiving units 200a and 200b to monitor the light output of the light generated in the light emitting unit 100. Furthermore, with the third clad layer 204 and the fourth clad layer 208, it is possible to suppress or prevent leakage of light from the light-absorbing layer 206.

As an example of the light receiving and emitting device 1000 according to this embodiment, the GaAs system has been described. However, the light receiving and emitting device 1000 can use any material system which can form an emission gain region. As for a semiconductor material, semiconductor materials such as an InGaAlP system, an AlGaN system, an InGaN system, an InGaAs system, a GaInNAs system, and a ZnCdSe system can be used.

The light receiving and emitting device 1000 according to this embodiment can be applied to a light source of, for example, a projector, a display, an illuminating device, and a measuring device.

The light receiving and emitting device 1000 has, for example, the following features.

In the light receiving and emitting device 1000 according to this embodiment, the light emitting unit 100 and the light receiving units 200a and 200b can be formed on the same substrate 10. This makes it easy to configure the light receiving and emitting device in the form of an array, which will be described later. Moreover, as compared with when a light receiving element is provided separately, for example, it is possible to reduce the number of parts and production costs.

In the light receiving and emitting device 1000 according to this embodiment, the light output of the light generated in the light emitting unit 100 can be monitored in the light receiving units 200a and 200b. Therefore, based on the monitored light output, it is possible to adjust the voltage value to be applied to the light emitting unit 100. This makes it possible to provide a light receiving and emitting device that can reduce unevenness of brightness and automatically adjust brightness. The light output of the light generated in the light emitting unit 100 can be so controlled as to be feed back to the voltage value to be applied to the light emitting unit 100 by using an external electronic circuit (not shown), for example.

In the light receiving and emitting device 1000, the reflected lights 2b and 4b reflected from the edge faces 151 and 152 of the gain region 140 can be received by the light receiving units 200a and 200b. Therefore, as compared with when the light emitted from the light emitting unit 100 is directly monitored, since the amount of light arriving at the light receiving units 200a and 200b is small, it is possible to increase the light output of the light emitting unit 100. Moreover, since the reflectivity of the edge faces 151 and 152 of the gain region 140 can be controlled by the antireflection film 110, it is possible to control the amounts of reflected lights 2b and 4b arriving at the light receiving units 200a and 200b.

In the light receiving and emitting device 1000, the gain region 140 can be provided so as to be inclined with respect to the perpendicular P of the first side face 105. Furthermore, in the gain region 140, the first edge face 151 and the second edge face 152 can be formed so as not to overlap each other as seen from the first side face 105 in a planar view. As a result, as has been described above, it is possible to suppress or prevent the occurrence of lasing in the gain region 140. This makes it possible to reduce speckle noise. In addition, in the light receiving and emitting device 1000, the light generated in the gain region 140 can travel while receiving a gain in the gain region 140 and can be emitted to the outside. This makes it possible to obtain higher output power than an existing and commonly-used LED (light emitting diode). As described above, with the light receiving and emitting device 1000, it is possible to reduce speckle noise and realize high output power.

2. Method for Producing the Light Receiving and Emitting Device

Next, an example of a method for producing the light receiving and emitting device 1000 will be described with reference to the drawings.

Figure 4:
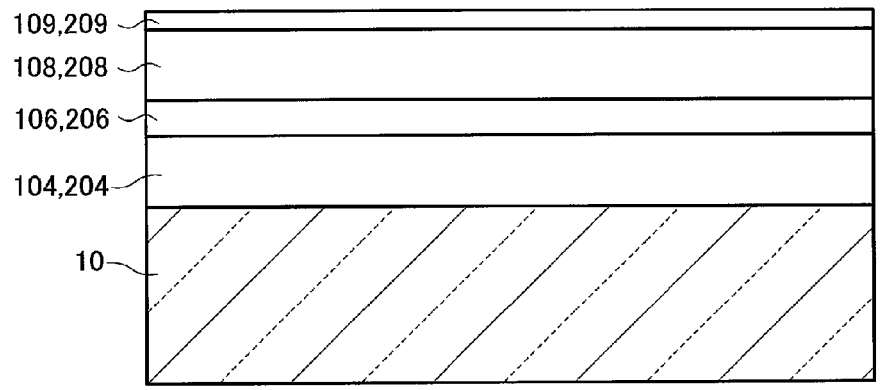
FIG. 4 is a sectional view schematically showing a process of producing the light receiving and emitting device according to the embodiment.

FIG. 4 is a sectional view schematically showing a process of producing the light receiving and emitting device 1000, the sectional view corresponding to the sectional view shown in FIG. 2.

As shown in FIG. 4, for example, on the substrate 10, a layer forming the first clad layer 104 and the third clad layer 204, a layer forming the active layer 106 and the light-absorbing layer 206, a layer forming the second clad layer 108 and the fourth clad layer 208, and a layer forming the first contact layer 109 and the second contact layer 209 are epitaxially grown in this order. As the epitaxial growth method, a method such as MOCVD (metal-organic chemical vapor deposition) or MBE (molecular beam epitaxy) can be used.

As shown in FIG. 2, the second electrode 122 and the fourth electrode 212 are formed on the first contact layer 109, for example. The second electrode 122 and the fourth electrode 212 are formed by, for example, after forming a conductive layer on the entire surface by a vacuum evaporation method, patterning the conductive layer by using photolithography and an etching technique. Moreover, the second electrode 122 and the fourth electrode 212 can also be formed into a desired shape by a combination of a vacuum evaporation method and a liftoff technique, for example.

Next, the first electrode 120 and the third electrode 210 are formed on the under surface of the substrate 10. The first electrode 120 and the third electrode 210 are formed by the same production method as the second electrode 122 described above.

By the above process, the light receiving and emitting device 1000 is obtained.

According to the method for producing the light receiving and emitting device 1000, a layer forming the light emitting unit 100 and a layer forming the light receiving units 200a and 200b can be formed in the same process. Therefore, as compared with when a layer forming the light emitting unit 100 and a layer forming the light receiving units 200a and 200b are formed separately, it is possible to simplify the production process.

According to the method for producing the light receiving and emitting device 1000, it is possible to form the light receiving and emitting device 1000 that allows the light emitting unit and the light receiving unit to be mounted on the same substrate 10.

3. MODIFIED EXAMPLES

Next, modified examples of the light receiving and emitting device according to this embodiment will be described. Incidentally, only a point that differs from the example of the light receiving and emitting device 1000 shown in FIGS. 1 and 2 described above will be described. Common points are identified with the same reference numerals, and their descriptions will be omitted.

(1) First Modified Example

First, a first modified example will be described.

Figure 5:
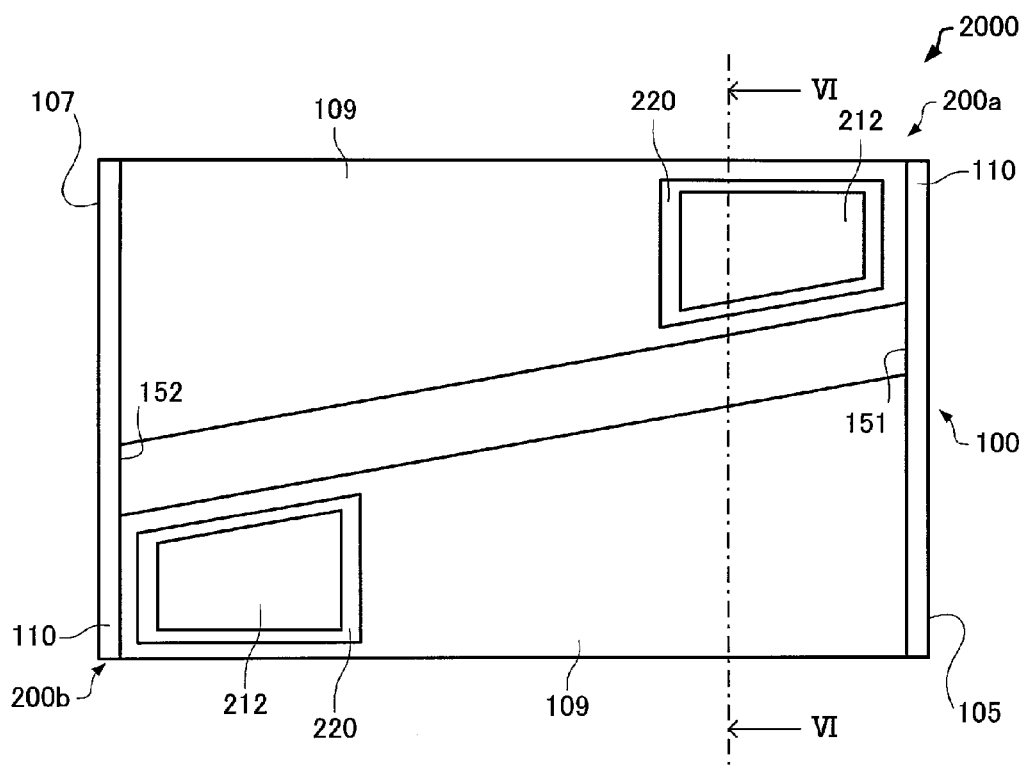
FIG. 5 is a plan view schematically showing a light receiving and emitting device according to a first modified example of the embodiment.
Figure 6:
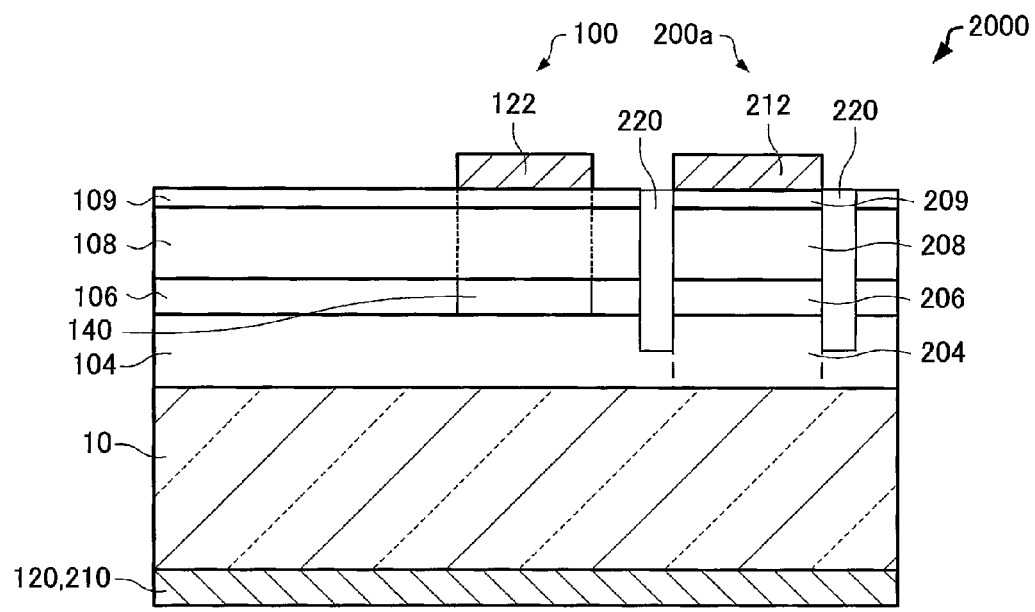
FIG. 6 is a sectional view schematically showing the light receiving and emitting device according to the first modified example of the embodiment.

FIG. 5 is a plan view schematically showing a light receiving and emitting device 2000 according to this modified example. FIG. 6 is a sectional view taken on the line VI-VI of FIG. 5 and corresponds to FIG. 2.

The light receiving and emitting device 2000 according to this modified example has a separation groove 220 achieving electrical separation between the light emitting unit 100 and the light receiving units 200a and 200b.

As shown in FIG. 5, the separation groove 220 is provided so as to surround each of the first light receiving unit 200a and the second light receiving unit 200b as seen in a planar view. Though not shown in the drawing, for example, the separation groove 220 may be linearly provided between the light emitting unit 100 and the first light receiving unit 200a and between the light emitting unit 100 and the second light receiving unit 200b from the first side face 105 of the active layer 106 to the second side face 107 as seen in a planar view. As shown in FIG. 6, the level of the bottom of the separation groove 220 may be below the level of the bottoms of the active layer 106 and the light-absorbing layer 206. The inside of the separation groove 220 may be a gap (air).

The light receiving and emitting device 2000 according to this modified example can include the separation groove 220 achieving electrical separation between the light emitting unit 100 and the light receiving units 200a and 200b. This makes current diffusion unlikely to occur between the light emitting unit 100 and the light receiving units 200a and 200b, making it possible to suppress electrical interference between the light emitting unit 100 and the light receiving units 200a and 200b. Moreover, since the light emitting unit 100 and the light receiving units 200a and 200b can be electrically separated by the separation groove 220, though not shown in the drawing, when a semi-insulating GaAs substrate or the like is used as the substrate 10, for example, it is possible to obtain a four-terminal structure in which the light emitting unit 100 and the light receiving units 200a and 200b can be independently driven.

(2) Second Modified Example

Next, a second modified example will be described.

Figure 7:
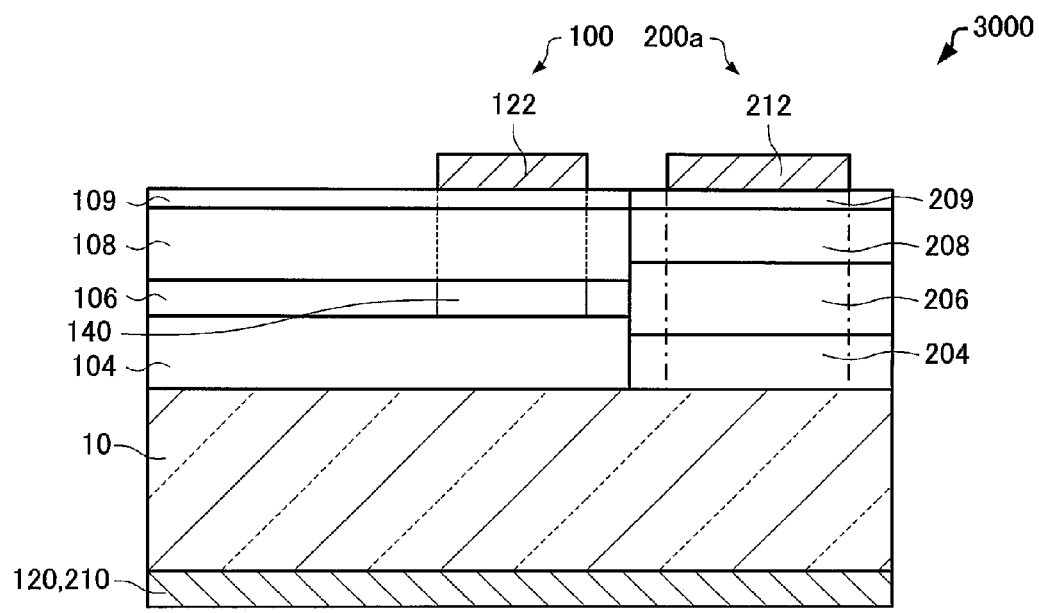
FIG. 7 is a sectional view schematically showing a light receiving and emitting device according to a second modified example of the embodiment.

FIG. 7 is a sectional view schematically showing a light receiving and emitting device 3000 according to this modified example and corresponds to FIG. 2.

In the example of the light receiving and emitting device 1000, a case in which the light emitting unit 100 and the light receiving units 200a and 200b have the same layer structure has been described. By contrast, in this modified example, the light emitting unit 100 and the light receiving units 200a and 200b are allowed to have different layer structures.

As shown in FIG. 7, the film thickness of the active layer 106 is thinner than the film thickness of the light-absorbing layer 206, for example. More specifically, the level of the under surface of the active layer 106 may be higher than the level of the under surface of the light-absorbing layer 206, and the level of the upper surface of the active layer 106 may be lower than the level of the upper surface of the light-absorbing layer 206. As a result, in the light receiving and emitting device 3000 according to this modified example, it is possible to improve light detection efficiency of the light receiving units 200a and 200b. It is preferable that the film thickness of the light-absorbing layer 206 be twice or more than twice as thick as the film thickness of the active layer 106, for example. Incidentally, the layer structure of the light receiving units 200a and 200b is not limited to a particular structure.

A method for producing the light receiving and emitting device 3000 is as follows. First, on the entire surface of the substrate 10, the first clad layer 104, the active layer 106, the second clad layer 108, and the first contact layer 109 are epitaxially grown in this order. Next, patterning is performed on the layers 104, 106, 108, and 109 on the substrate 10, whereby the substrate 10 in the regions where the light receiving units 200a and 200b are provided is exposed. Then, on the exposed substrate 10 and the second contact layer 209, the third clad layer 204, the light-absorbing layer 206, the fourth clad layer 208, and the second contact layer 209 are formed in this order. Etchback is performed on the layers on the first contact layer 109. The processes that follows are the same as those of the example of the light receiving and emitting device 1000 and therefore omitted. By the processes described above, the light receiving and emitting device 3000 is obtained.

(3) Third Modified Example

Next, a third modified example will be described.

Figure 8:
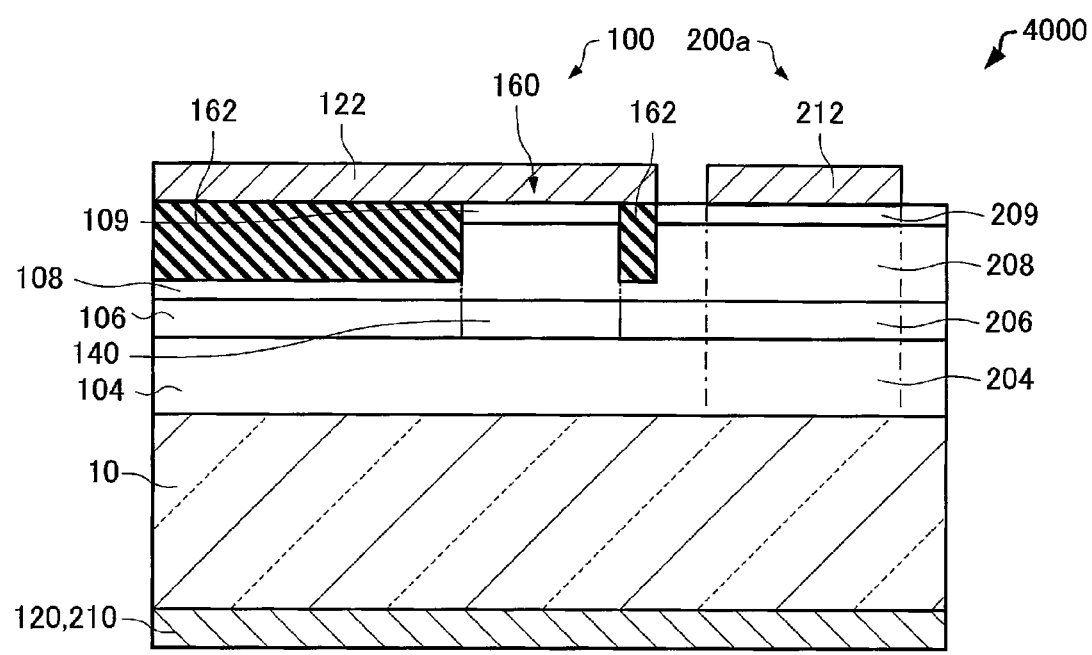
FIG. 8 is sectional view schematically showing a light receiving and emitting device according to a third modified example of the embodiment.

FIG. 8 is a sectional view schematically showing a light receiving and emitting device 4000 according to this modified example and corresponds to FIG. 2.

In the example of the light receiving and emitting device 1000, a gain guide type in which the gain region simply serves as a waveguide region has been described. By contrast, in this modified example, a refractive index waveguide type in which the light is trapped by setting a refractive index difference can be used.

As shown in FIG. 8, part of the first contact layer 109 and part of the second clad layer 108 can form a columnar portion 160. The planar shape of the columnar portion 160 is the same as the gain region 140, for example. That is, for example, the planar shape of the columnar portion 160 determines a current path between the electrodes 120 and 122, and, consequently, determines the planar shape of the gain region 140. Incidentally, though not shown in the drawing, the columnar portion 160 may be formed of the first contact layer 109, the second clad layer 108, and the active layer 106, or may also include the first clad layer 104. Moreover, the side of the columnar portion 160 may be inclined.

As shown in FIG. 8, an insulating portion 162 is formed on the second clad layer 108 and on the sides of the columnar portion 160. The insulating portion 162 can be in contact with the side faces of the columnar portion 160. The upper surface of the insulating portion 162 is continuous with the upper surface of the first contact layer 109, for example. As the insulating portion 162, a SiN layer, a $SiO_2$ layer, and a polyimide layer, for example, can be used. When these materials are used as the insulating portion 162, the current between the electrodes 120 and 122 can flow through the columnar portion 160 sandwiched between the insulating portions 162 while passing around the insulating portions 162. The insulating portion 162 may have a refractive index which is lower than the refractive index of the active layer 106. In this case, the effective refractive index of a vertical section of a part where the insulating portion 162 is formed is lower than the effective refractive index of a vertical section of a part where the insulating portion 162 is not formed, that is, a part where the columnar portion 160 is formed. This makes it possible to trap the light in the gain region 140 effectively in a planar direction. Incidentally, though not shown in the drawing, the insulating portion 162 may not be provided and may be understood as air.

The second electrode 122 is formed on the first contact layer 109 (the columnar portion 160) and the insulating portion 162. A surface of the second electrode 122, the surface where the second electrode 122 is in contact with the first contact layer 109, has the same planar shape as the gain region 140. Though not shown in the drawing, the second electrode 122 may be formed only on the first contact layer 109.

According to this modified example, as is the case with the example of the light receiving and emitting device 1000 described earlier, it is possible to obtain a light receiving and emitting device in which the light emitting unit 100 and the light receiving units 200a and 200b are formed on the same substrate.

(4) Fourth Modified Example

Next, a fourth modified example will be described.

Figure 9:
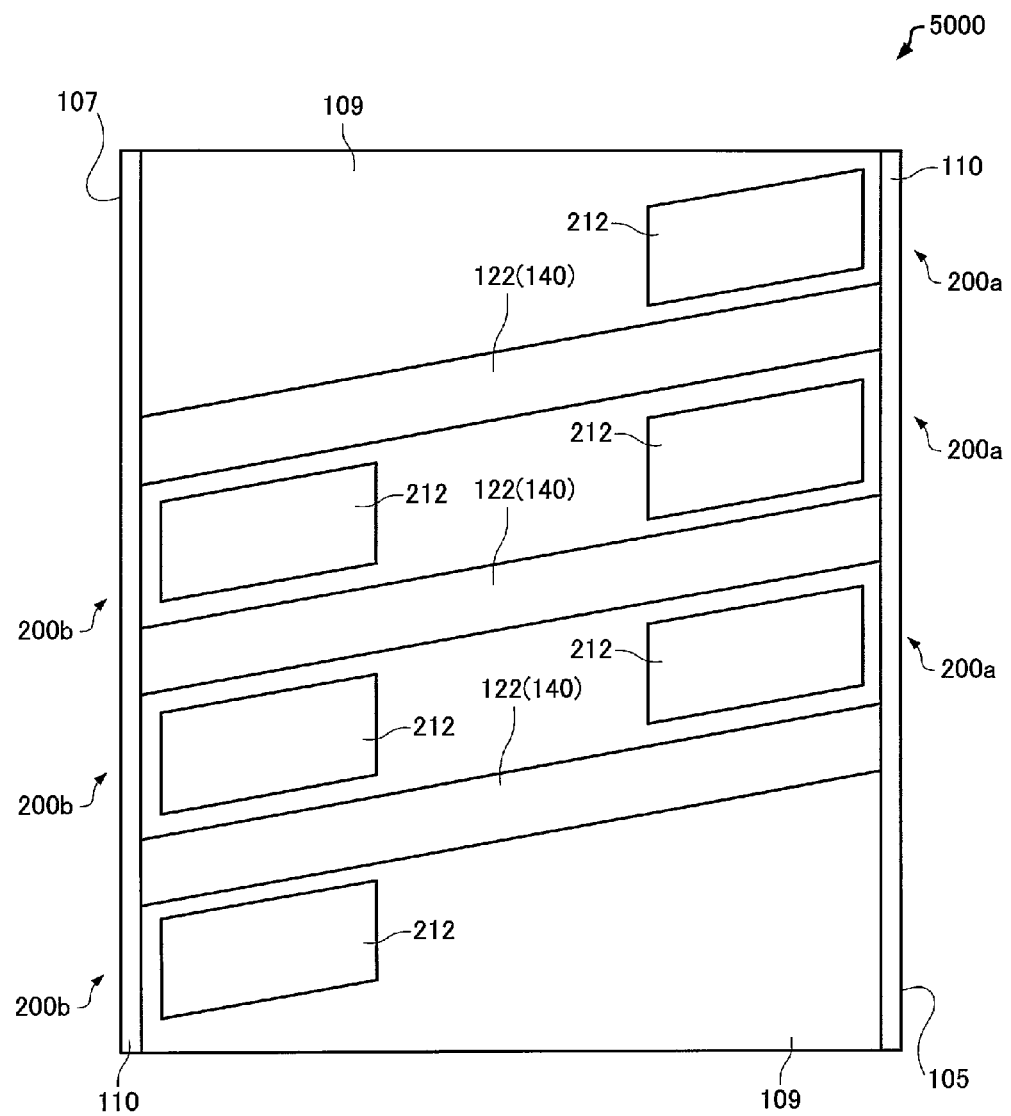
FIG. 9 is a plan view schematically showing a light receiving and emitting device according to a fourth modified example of the embodiment.

FIG. 9 is a plan view schematically showing a light receiving and emitting device 5000 according to this modified example.

As shown in FIG. 9, in the light receiving and emitting device 5000, a plurality of gain regions 140 are arranged. The light receiving units 200a and 200b are provided for each of the plurality of gain regions 140. Though not shown in the drawing, the light receiving and emitting device 5000 may have separation grooves electrically separating the plurality of gain regions 140.

According to the light receiving and emitting device 5000, it is possible to emit light on high power compared to the light receiving and emitting device 1000.

Moreover, in the light receiving and emitting device 5000, the light receiving units 200a and 200b can be provided for each of the plurality of gain regions 140. Therefore, it is possible to monitor the light output of each of the plurality of gain regions 140. That is, it is possible to detect the amounts of light of the plurality of gain regions 140 individually.

It should be understood that the modified examples described hereinbefore are merely examples, and the invention is not limited to these modified examples. For example, the embodiment and the modified examples can be combined appropriately.

While the embodiment of the invention has been described in detail, it will be apparent to those skilled in the art that the embodiment may be modified in numerous ways without substantially departing from the new matter and effect of the invention. It is therefore to be understood that all modified examples of the invention are encompassed in the scope of the invention.

What is claimed is:

1. A light emitting device comprising:
   a substrate; and
   a light emitting unit, a first light receiving unit, and a second light receiving unit that are provided on the substrate,
   wherein
   the light emitting unit includes
      an active layer sandwiched between a first clad layer and a second clad layer,
      a first electrode electrically connected to the first clad layer, and
      a second electrode electrically connected to the second clad layer,
   at least part of the active layer forms a gain region that generates first light by a voltage applied between the first electrode and the second electrode,
   the gain region is provided from a first side face of the active layer to a second side face parallel to the first side face so as to be inclined with respect to a perpendicular of the first side face as seen in a planar view,
   the first light is divided, at a first edge face on the first side face and a second edge face on the second side face, into second light emitted to an outside and third and fourth light respectively reflected at the first and second edge faces,
   the third light is received by the first light receiving unit, and
   the fourth light is received by the second light receiving unit.

2. The light emitting device according to claim 1, wherein
   the first light receiving unit is provided on a side where the first side face is present, and
   the second light receiving unit is provided on a side where the second side face is present.

3. The light emitting device according to claim 1, further comprising:
   a first separation groove and a second separation groove electrically separating the light emitting unit and the first light receiving unit and the second light receiving unit, respectively.

4. The light emitting device according to claim 3, wherein
   the first separation groove and the second separation groove respectively surround the first light receiving unit and the second light receiving unit as seen in a planar view.

5. The light emitting device according to claim 1, wherein
   the first and second light receiving units include first and second light absorbing layers, respectively, and
   the active layer and the first and second light-absorbing layers are formed as a continuous one layer.

6. The light emitting device according to claim 1, wherein
   the first and second light receiving units include first and second light absorbing layers, respectively,
   a level of an under surface of the active layer is higher than a level of an under surface of each of the first and second light-absorbing layers, and
   a level of an upper surface of the active layer is lower than a level of an upper surface of each of the first and second light-absorbing layers.

7. The light emitting device according to claim 1, wherein
   the first and second edge faces do not overlap each other as seen from the first side face in a planar view.

8. The light emitting device according to claim 1, wherein
   the gain region comprises a plurality of gain regions, the gain regions being arranged, and
   the first and second light receiving units are provided for each of the plurality of gain regions.

* * * * *